(12) United States Patent
Subramonium et al.

(10) Patent No.: US 8,962,101 B2
(45) Date of Patent: *Feb. 24, 2015

(54) METHODS AND APPARATUS FOR PLASMA-BASED DEPOSITION

(71) Applicant: Novellus Systems, Inc., Fremont, CA (US)

(72) Inventors: Pramod Subramonium, Beaverton, OR (US); Aaron Bingham, Dundee, OR (US); Tim Thomas, Wilsonville, OR (US); Jon Henri, West Linn, OR (US); Greg Farhner, Beaverton, OR (US)

(73) Assignee: Novellus Systems, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/974,808

(22) Filed: Aug. 23, 2013

(65) Prior Publication Data

US 2014/0057454 A1 Feb. 27, 2014

Related U.S. Application Data

(62) Division of application No. 11/849,208, filed on Aug. 31, 2007, now abandoned.

(51) Int. Cl.
*H05H 1/24* (2006.01)
*H01L 21/469* (2006.01)

(52) U.S. Cl.
CPC .................. *H01L 21/469* (2013.01)
USPC .......... 427/577; 427/249.1; 427/569

(58) Field of Classification Search
CPC .... C23C 16/26; C23C 16/272; C23C 16/505; C23C 16/27; H05H 1/24; H05H 1/46; H01L 21/31; H01L 21/00
USPC .......................................... 427/569
See application file for complete search history.

(56) References Cited

U.S. PATENT DOCUMENTS 3,816,976 A 6/1974 Stork et al.
4,209,357 A 6/1980 Gorin et al.

(Continued)

FOREIGN PATENT DOCUMENTS

FR 2853313 10/2004
JP 62019539 1/1987

(Continued)

OTHER PUBLICATIONS

U.S. Appl. No. 13/032,392, filed Feb. 22, 2011, entitled "Improved Diffusion Barrier and Etch Stop Films".

(Continued)

*Primary Examiner* — Elizabeth Burkhart
(74) *Attorney, Agent, or Firm* — Weaver Austin Villeneuve & Sampson LLP

(57) ABSTRACT

High-deposition rate methods for forming transparent ashable hardmasks (AHMs) that have high plasma etch selectivity to underlying layers are provided. The methods involve placing a wafer on a powered electrode such as a powered pedestal for plasma-enhanced deposition. According to various embodiments, the deposition is run at low hydrocarbon precursor partial pressures and/or low process temperatures. Also provided are ceramic wafer pedestals with multiple electrode planes embedded with the pedestal are provided. According to various embodiments, the pedestals have multiple RF mesh electrode planes that are connected together such that all the electrode planes are at the same potential.

19 Claims, 11 Drawing Sheets

(56) References Cited

U.S. PATENT DOCUMENTS

| | | |
|---|---|---|
| 4,274,841 A | 6/1981 | Andersen et al. |
| 4,512,841 A | 4/1985 | Cunningham, Jr. et al. |
| 4,668,261 A | 5/1987 | Chatzipetros et al. |
| 4,673,589 A | 6/1987 | Standley |
| 4,863,493 A | 9/1989 | Kotani et al. |
| 4,863,760 A | 9/1989 | Schantz et al. |
| 4,975,144 A | 12/1990 | Yamazaki et al. |
| 5,222,549 A | 6/1993 | Ishii et al. |
| 5,231,057 A | 7/1993 | Doki et al. |
| 5,261,250 A | 11/1993 | Missimer |
| 5,378,316 A | 1/1995 | Franke et al. |
| 5,470,661 A | 11/1995 | Bailey et al. |
| 5,562,952 A | 10/1996 | Nakahigashi et al. |
| 5,670,066 A | 9/1997 | Barnes et al. |
| 5,792,269 A | 8/1998 | Deacon et al. |
| 5,900,288 A | 5/1999 | Kuhman et al. |
| 5,985,103 A | 11/1999 | Givens et al. |
| 6,006,797 A | 12/1999 | Bulow et al. |
| 6,030,591 A | 2/2000 | Tom et al. |
| 6,035,803 A | 3/2000 | Robles et al. |
| 6,041,734 A | 3/2000 | Raoux et al. |
| 6,042,686 A | 3/2000 | Dible et al. |
| 6,066,209 A | 5/2000 | Sajoto et al. |
| 6,150,719 A | 11/2000 | Saia et al. |
| 6,241,793 B1 | 6/2001 | Lee et al. |
| 6,286,321 B1 | 9/2001 | Glater |
| 6,319,299 B1 | 11/2001 | Shih et al. |
| 6,331,480 B1 | 12/2001 | Tsai et al. |
| 6,367,413 B1 | 4/2002 | Sill et al. |
| 6,387,819 B1 | 5/2002 | Yu |
| 6,458,516 B1 | 10/2002 | Ye et al. |
| 6,465,051 B1 | 10/2002 | Sahin et al. |
| 6,478,924 B1 | 11/2002 | Shamouilian et al. |
| 6,541,397 B1 | 4/2003 | Bencher |
| 6,573,030 B1 | 6/2003 | Fairbairn et al. |
| 6,613,434 B1 | 9/2003 | Drevillon et al. |
| 6,617,553 B2 | 9/2003 | Ho et al. |
| 6,635,185 B2 | 10/2003 | Demmin |
| 6,642,661 B2 | 11/2003 | Strang |
| 6,777,349 B2 | 8/2004 | Fu et al. |
| 6,787,452 B2 | 9/2004 | Sudijono et al. |
| 6,787,819 B2 | 9/2004 | Rhodes et al. |
| 6,967,072 B2 | 11/2005 | Latchford et al. |
| 7,064,078 B2 | 6/2006 | Liu et al. |
| 7,202,176 B1 | 4/2007 | Goto et al. |
| 7,205,228 B2 | 4/2007 | Padhi et al. |
| 7,220,982 B2 | 5/2007 | Campbell |
| 7,223,526 B2 | 5/2007 | Fairbairn et al. |
| 7,235,478 B2 | 6/2007 | Geng et al. |
| 7,288,484 B1 | 10/2007 | Goto et al. |
| 7,314,506 B2 | 1/2008 | Vininski et al. |
| 7,323,401 B2 | 1/2008 | Ramaswamy et al. |
| 7,381,644 B1 | 6/2008 | Subramonium et al. |
| 7,399,712 B1 | 7/2008 | Graff |
| 7,432,467 B2 | 10/2008 | Yamazawa |
| 7,495,984 B2 | 2/2009 | Kim et al. |
| 7,576,009 B2 | 8/2009 | Lee et al. |
| 7,767,054 B2 | 8/2010 | Kobayashi et al. |
| 7,803,715 B1 | 9/2010 | Haimson et al. |
| 7,820,556 B2 | 10/2010 | Hsu et al. |
| 7,915,166 B1 | 3/2011 | Yu et al. |
| 7,955,990 B2 | 6/2011 | Henri et al. |
| 7,981,777 B1 * | 7/2011 | Subramonium et al. ...... 438/485 |
| 7,981,810 B1 * | 7/2011 | Subramonium et al. ...... 438/778 |
| 8,018,163 B2 | 9/2011 | Wi |
| 8,110,493 B1 | 2/2012 | Subramonium et al. |
| 8,114,782 B2 | 2/2012 | Graff |
| 8,129,281 B1 | 3/2012 | Cheung et al. |
| 8,227,352 B2 | 7/2012 | Yu et al. |
| 8,309,473 B2 | 11/2012 | Hsu et al. |
| 8,435,608 B1 | 5/2013 | Subramonium et al. |
| 8,563,414 B1 | 10/2013 | Fox et al. |
| 8,569,179 B2 | 10/2013 | Graff |
| 8,664,124 B2 | 3/2014 | Graff |
| 8,669,181 B1 | 3/2014 | Yu et al. |
| 2001/0021491 A1 | 9/2001 | Chen et al. |
| 2002/0094591 A1 | 7/2002 | Sill et al. |
| 2002/0182848 A1 | 12/2002 | Joseph et al. |
| 2003/0044532 A1 | 3/2003 | Lee et al. |
| 2003/0052085 A1 | 3/2003 | Parsons |
| 2003/0079983 A1 | 5/2003 | Long et al. |
| 2003/0106647 A1 | 6/2003 | Koshiishi et al. |
| 2004/0000534 A1 * | 1/2004 | Lipinski ........................ 216/58 |
| 2004/0016972 A1 | 1/2004 | Singh et al. |
| 2004/0018750 A1 | 1/2004 | Sophie et al. |
| 2004/0023502 A1 | 2/2004 | Tzou et al. |
| 2004/0140506 A1 | 7/2004 | Singh et al. |
| 2004/0180551 A1 | 9/2004 | Biles et al. |
| 2004/0224504 A1 | 11/2004 | Gadgil |
| 2004/0266195 A1 | 12/2004 | Dokumaci et al. |
| 2005/0042889 A1 | 2/2005 | Lee et al. |
| 2005/0054202 A1 | 3/2005 | Pan et al. |
| 2005/0098106 A1 | 5/2005 | Fink et al. |
| 2005/0098119 A1 | 5/2005 | Burger et al. |
| 2005/0112506 A1 | 5/2005 | Czech et al. |
| 2005/0129935 A1 | 6/2005 | Kunitake et al. |
| 2005/0130404 A1 | 6/2005 | Moghadam et al. |
| 2005/0167394 A1 | 8/2005 | Liu et al. |
| 2005/0202683 A1 | 9/2005 | Wang et al. |
| 2005/0260411 A1 | 11/2005 | Ravi |
| 2005/0287771 A1 * | 12/2005 | Seamons et al. .............. 438/482 |
| 2006/0019486 A1 | 1/2006 | Yu et al. |
| 2006/0091559 A1 | 5/2006 | Nguyen et al. |
| 2006/0154086 A1 | 7/2006 | Fuller et al. |
| 2006/0154477 A1 | 7/2006 | Geng et al. |
| 2006/0197881 A1 | 9/2006 | Kang et al. |
| 2006/0205223 A1 | 9/2006 | Smayling |
| 2006/0219363 A1 | 10/2006 | Matsumoto et al. |
| 2006/0231524 A1 | 10/2006 | Liu et al. |
| 2007/0032054 A1 | 2/2007 | Ramaswamy et al. |
| 2007/0048674 A1 | 3/2007 | Wells |
| 2007/0054500 A1 | 3/2007 | Bencher |
| 2007/0059913 A1 | 3/2007 | King et al. |
| 2007/0077780 A1 | 4/2007 | Wang et al. |
| 2007/0105303 A1 | 5/2007 | Busch et al. |
| 2007/0125762 A1 | 6/2007 | Cui et al. |
| 2007/0128538 A1 | 6/2007 | Fairbairn et al. |
| 2007/0140029 A1 | 6/2007 | Kim et al. |
| 2007/0166546 A1 | 7/2007 | Ichikawa et al. |
| 2007/0166979 A1 | 7/2007 | Wang et al. |
| 2007/0202640 A1 | 8/2007 | Al-Bayati et al. |
| 2007/0235412 A1 | 10/2007 | Fischer |
| 2007/0247073 A1 | 10/2007 | Paterson et al. |
| 2008/0017318 A1 | 1/2008 | Kobayashi et al. |
| 2008/0073636 A1 | 3/2008 | Kim |
| 2008/0083916 A1 | 4/2008 | Kim |
| 2008/0128907 A1 | 6/2008 | Yang et al. |
| 2008/0200003 A1 | 8/2008 | Hong et al. |
| 2008/0242912 A1 | 10/2008 | Letessier et al. |
| 2008/0254639 A1 | 10/2008 | Graff |
| 2008/0254641 A1 | 10/2008 | Kobayashi et al. |
| 2008/0264803 A1 | 10/2008 | Agrawal |
| 2009/0182180 A1 | 7/2009 | Huang et al. |
| 2009/0206058 A1 | 8/2009 | Iwata et al. |
| 2009/0305516 A1 | 12/2009 | Hsu et al. |
| 2010/0151691 A1 | 6/2010 | Henri et al. |
| 2010/0297853 A1 | 11/2010 | Hsu et al. |
| 2011/0244142 A1 | 10/2011 | Cheng et al. |
| 2011/0253672 A1 | 10/2011 | Kamibayashi et al. |
| 2012/0149207 A1 | 6/2012 | Graff |
| 2012/0164834 A1 | 6/2012 | Jennings et al. |
| 2012/0196446 A1 | 8/2012 | Graff |

FOREIGN PATENT DOCUMENTS

| | | |
|---|---|---|
| JP | H02-35438 U | 3/1990 |
| JP | 08152262 | 6/1996 |
| JP | 09-176860 | 7/1997 |
| JP | 10326772 | 12/1998 |
| JP | 2002-009043 | 1/2002 |
| JP | 2002-231798 | 8/2002 |
| JP | 4436575 | 3/2010 |
| JP | 2012/089694 | 10/2012 |

(56) References Cited

FOREIGN PATENT DOCUMENTS

| SU | 382671 | 5/1973 |
|---|---|---|
| WO | 2005/048367 | 5/2005 |
| WO | 2012/087737 | 6/2012 |

OTHER PUBLICATIONS

U.S. Appl. No. 11/849,208, filed Aug. 31, 2007, entitled "Methods and Apparatus for Plasma-Based Deposition".
U.S. Appl. No. 12/766,721, filed Apr. 23, 2010, entitled "Methods for Forming Conductive Carbon Films by PECVD".
U.S. Appl. No. 13/856,364, filed Apr. 3, 2013, entitled "Methods of Depositing Smooth and Conformal Ashable Hard Mask Films".
U.S. Appl. No. 13/160,399, filed Jun. 14, 2011, entitled "Methods of Depositing Highly Selective Transparent Ashable Hardmask Films".
US Notice of Allowance, dated Oct. 4, 2006, issued in U.S. Appl. No. 11/318,269.
US Office Action, dated Dec. 14, 2006, issued in U.S. Appl. No. 11/318,269.
US Notice of Allowance, dated May 7, 2007, issued in U.S. Appl. No. 11/318,269.
US Office Action, dated Aug. 27, 2007, issued in U.S. Appl. No. 11/318,269.
US Notice of Allowance, dated Jan. 7, 2008, issued in U.S. Appl. No. 11/318,269.
US Office Action, dated Nov. 22, 2010, issued in U.S. Appl. No. 12/048,967.
US Office Action, dated Apr. 18, 2011, issued in U.S. Appl. No. 12/048,967.
US Notice of Allowance, dated Oct. 7, 2011, issued in U.S. Appl. No. 12/048,967.
US Office Action dated, Dec. 27, 2007, issued in U.S. Appl. No. 11/449,983.
US Office Action, dated Jul. 9, 2008, issued in U.S. Appl. No. 11/449,983.
US Office Action, dated Jan. 5, 2009, issued in U.S. Appl. No. 11/449,983.
US Office Action, dated Sep. 15, 2009, issued in U.S. Appl. No. 11/449,983.
US Notice of Allowance, dated Mar. 16, 2010, issued in U.S. Appl. No. 11/449,983.
US Office Action, dated Jun. 21, 2010, issued in U.S. Appl. No. 11/449,983.
US Office Action, dated Dec. 30, 2010, issued in U.S. Appl. No. 11/449,983.
US Office Action, dated Jun. 1, 2007, issued in U.S. Appl. No. 11/612,382.
US Office Action, dated Oct. 9, 2007, issued in U.S. Appl. No. 11/612,382.
US Final Office Action, dated May 13, 2008, issued in U.S. Appl. No. 11/612,382.
US Office Action, dated Aug. 19, 2008, issued in U.S. Appl. No. 11/612,382.
US Final Office Action, dated Feb. 24, 2009, issued in U.S. Appl. No. 11/612,382.
US Final Office Action, dated May 12, 2009, issued in U.S. Appl. No. 11/612,382.
US Final Office Action, dated Dec. 9, 2009, issued in U.S. Appl. No. 11/612,382.
US Office Action, dated Mar. 26, 2010, issued in U.S. Appl. No. 11/612,382.
US Office Action dated Nov. 20, 2009, issued in U.S. Appl. No. 11/710,652.
US Office Action dated Jul. 9, 2013, issued in U.S. Appl. No. 13/032,392.
US Office Action, dated Jan. 5, 2009, issued in U.S. Appl. No. 11/710,377.
US Office Action, dated Aug. 19, 2009, issued in U.S. Appl. No. 11/710,377.
US Office Action, dated Mar. 31, 2010, issued in U.S. Appl. No. 11/710,377.
US Notice of Allowance, dated Mar. 22, 2011, issued in U.S. Appl. No. 11/710,377.
US Office Action, dated Sep. 3, 2010, issued in U.S. Appl. No. 11/849,208.
US Final Office Action, dated Apr. 12, 2011, issued in U.S. Appl. No. 11/849,208.
US Final Office Action, dated Sep. 14, 2012, issued in U.S. Appl. No. 11/849,208.
US Final Office Action, dated Apr. 24, 2013, issued in U.S. Appl. No. 11/849,208.
US Office Action, dated Oct. 19, 2011, issued in U.S. Appl. No. 12/163,670.
US Office Action, dated Feb. 14, 2012, issued in U.S. Appl. No. 12/163,670.
US Office Action, dated Jul. 6, 2012, issued in U.S. Appl. No. 12/163,670.
US Final Office Action dated Oct. 18, 2012, issued in U.S. Appl. No. 12/163,670.
US Notice of Allowance dated Jan. 3, 2013, issued in U.S. Appl. No. 12/163,670.
US Notice of Allowance, dated Nov. 2, 2010, issued in U.S. Appl. No. 11/449,983.
US Supplemental Notice of Allowance, dated Feb. 8, 2011, issued in U.S. Appl. No. 12/334,220.
US Office Action, dated Aug. 19, 2009, issued in U.S. Appl. No. 12/133,223.
US Final Office Action, dated Dec. 21, 2009, issued in U.S. Appl. No. 12/133,223.
US Notice of Allowance, dated Mar. 2, 2010, issued in U.S. Appl. No. 12/133,223.
US Office Action, dated Nov. 9, 2011, issued in U.S. Appl. No. 12/786,842.
US Final Office Action, dated Apr. 19, 2012, issued in U.S. Appl. No. 12/786,842.
US Notice of Allowance, dated Jul. 20, 2012, issued in U.S. Appl. No. 12/786,842.
US Office Action, dated Aug. 10, 2012, issued in U.S. Appl. No. 12/766,721.
US Final Office Action, dated Mar. 14, 2013, issued in U.S. Appl. No. 12/766,721.
US Notice of Allowance, dated Jun. 28, 2013, issued in U.S. Appl. No. 12/766,721.
US Office Action, dated Feb. 15, 2013, issued in U.S. Appl. No. 13/371,184.
Notice of Allowance, dated Jul. 1, 2013, issued in U.S. Appl. No. 13/371,184.
Korean Office Action, dated Jun. 1, 2010, issued in U.S. Appl. No. 2009/0048358.
Callegari et al. (1993) "Optical properties of hydrogenated amorphous-carbon film for attenuated phase-shift mask applications," *J. Vac. Sci. Technol. B 11*(6), pp. 2697-2699.
Grill, A. (1999) "Diamond-like carbon: state of the art," *Diamond and Related Materials 8*,pp. 428-434.
Grill, A. (1999) "Plasma-deposited diamondlike carbon and related materials," IBM Journal of Research and Development, vol. 43, ½, http://research.ibm.com/journal/rd/431/grill.html.,14 pp.
Grill, et al. (1990) "Diamondlike carbon films by rf plasma-assisted chemical vapor deposition from acetylene," *IBM J. Res. Develop.*, vol. 34, No. 6, pp. 849-857.
Holmes et al. (1987) "Trimethylsilylacetylene", *Organic Syntheses, Coll.* vol. 8, p. 606; vol. 65, p. 61.
Ikeda et al. (1992) "Top-PECVD": A New Conformal Plasma Enhanced CVD Technology using TEOS, Ozone and Pulse-modulated RF Plasma, *IEEE*, pp. 11.2.1-11.2.4.
Jacobsohn et al. (1998) "Hydrogenated Carbon—Nitrogen Films Obtained by PECVD Using Acetylyne and Nitrogen As Precursor Gases," Mat. Res. Soc. Symp. Proc., 498: 283-288.
Kragler et al. (1995) "Scanning tunneling microscopy based lithography employing amorphous hydrogenated carbon as a high resolution resist mask," *Appl. Phys. Lett. 67* (8), pp. 1163-1165.

(56) References Cited

OTHER PUBLICATIONS

Kreupl, Franz et al. (2008) "Carbon-Based Resistive Memory," IEDM.

Muhl et al. (1999) "A Review of the Preparation of Carbon Nitride Films," Diamond and Related Materials, 8: 1809-1830.

van de Ven et al. (1990) "Advantages of Dual Frequency PECVD for Deposition of ILD and Passivation Films," VLSI Multilevel Interconnection Conference Proceedings, Seventh International IEEE, 194-201.

Voronkin et al. (1994) "Structure and mechanical properties of a-C:H films deposited onto polymer substrates: Diamond and Related Materials," 4, pp. 5-9.

Lemaire, P.J., et al. (1990) "Diffusion of Hydrogen Through Hermetic Carbon Films on Silica Fibers," Mat. Res. Symp. Proc., vol. 172, Materials Research Society, pp. 85-96.

US Office Action, dated Mar. 27, 2013, issued in U.S. Appl. No. 12/976,391.

International Search Report mailed Sep. 19, 2012, in Application No. PCT/US2011/065099.

PCT International Invitation to Pay Additional Fees and Partial Search Report dated Jul. 24, 2012, issued in Application No. PCT/US2011/065099.

U.S. Appl. No. 13/667,338, filed Nov. 2, 2012, entitled "High Temperature Electrode Connections."

U.S. Appl. No. 14/185,757, filed Feb. 20, 2014, entitled PECVD Films for EUV Lithography.

U.S. Appl. No. 14/248,046, filed Apr. 8, 2014, entitled High Selectivity and Low Stress Carbon Hardmask by Pulsed Low Frequency RF Power.

U.S. Appl. No. 11/612,382, filed Dec. 18, 2006, entitled "Methods of Improving Ashable Hardmask Adhesion to Metal layers".

US Notice of Allowance, dated Mar. 16, 2011, issued in U.S. Appl. No. 11/449,983.

US Final Office Action dated Apr. 15, 2010, issued in U.S. Appl. No. 11/710,652.

US Office Action dated Aug. 5, 2010, issued in U.S. Appl. No. 11/710,652.

US Notice of Allowance dated Nov. 24, 2010, issued in U.S. Appl. No. 11/710,652.

US Notice of Allowance dated Oct. 25, 2013, issued in U.S. Appl. No. 13/032,392.

US Office Action, dated Jun. 1, 2007, issued in U.S. Appl. No. 11/263,148.

US Final Office Action, dated Oct. 24, 2007, issued in U.S. Appl. No. 11/263,148.

US Notice of Allowance, dated Mar. 18, 2008, issued in U.S. Appl. No. 11/263,148.

US Office Action, dated May 2, 2011, issued in U.S. Appl. No. 11/263,148.

US Notice of Allowance, dated Oct. 13, 2011, issued in U.S. Appl. No. 11/263,148.

US Office Action, dated Oct. 9, 2013, issued in U.S. Appl. No. 13/372,363.

US Notice of Allowance, dated Dec. 30, 2013, issued in U.S. Appl. No. 13/372,363.

Ong, Soon-Eng et al. (2007) "Temperature effect on bonding structures of amorphous carbon containing more than 30at.% silicon," Diamond & Related Materials, 16:1823-1827.

\* cited by examiner

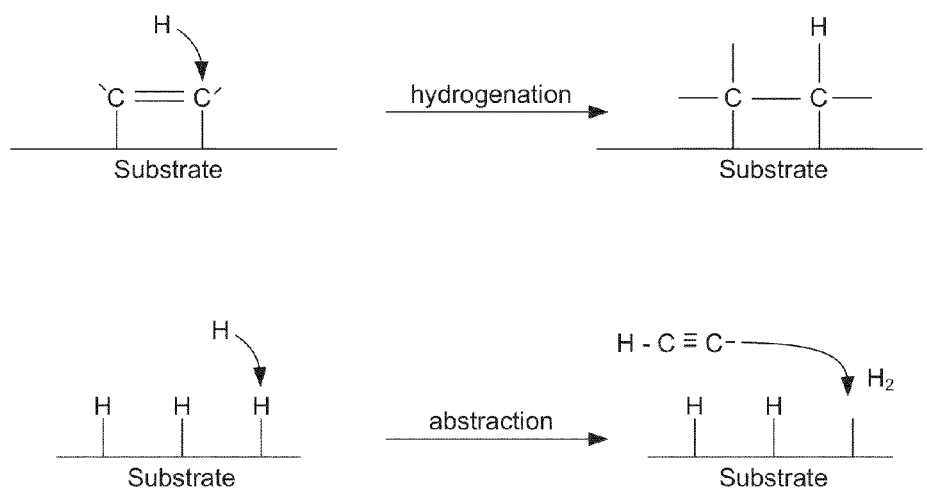
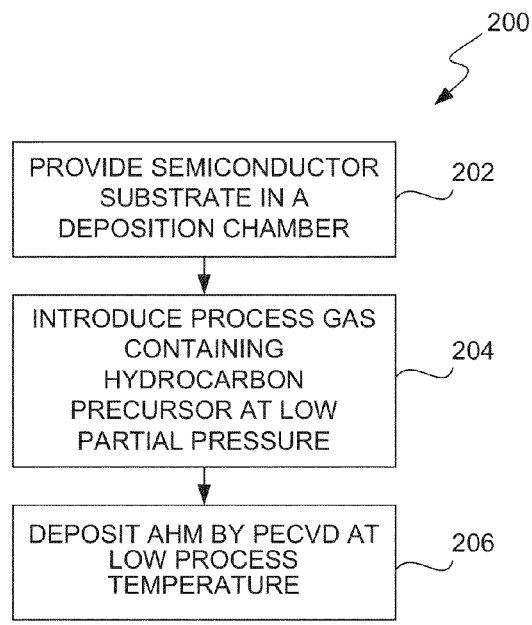
FIG. 1
FIG. 2 though it will be understood that it is not
METHODS AND APPARATUS FOR PLASMA-BASED DEPOSITION This application is a divisional of and claims priority from U.S. patent application Ser. No. 11/849,208, filed Aug. 31, 2007, titled "METHODS AND APPARATUS FOR PLASMA-BASED DEPOSITION," all of which is incorporated herein by this reference for all purposes.

BACKGROUND OF THE INVENTION

Ceramic pedestals are useful in applications in which processing temperatures are too high for aluminum pedestals to withstand. One such application is the deposition of ashable hardmasks (AHMs). AHMs are films used in semiconductor processing that may be removed by a technique referred to as "ashing." In particular, AHMs are often used as etch stop layers. 193 nm or lower lithography schemes require these AHMs to have high etch selectivity to underlying dielectric or metal barrier layers. In addition, 193 nm lithography schemes employ a 633 nm mask alignment laser—requiring the AHM to be transparent to light at 633 nm.

Current methods of producing highly selective AHMs rely on relatively high temperature (greater than 500 C) PECVD deposition processes. At these temperatures, dense films rich carbon are deposited. These conventional processes operate at pressures as high as 6-10 Torr—pressures at which many PECVD reactors are not designed to withstand. In addition, the extinction coefficient ("k value") of these films is higher than ideal for 193 nm lithography schemes.

SUMMARY OF THE INVENTION

High-deposition rate methods for forming transparent ashable hardmasks (AHMs) that have high plasma etch selectivity to underlying layers are provided. The methods involve placing a wafer on a powered electrode such as a powered pedestal for plasma-enhanced deposition. In certain embodiments the pedestal is a dual-frequency powered pedestal. According to various embodiments, the deposition is run at low hydrocarbon precursor partial pressures and/or low process temperatures. Also according to various embodiments, the AHMs produced have high etch selectivities and are transparent. The lower temperature process also allows reduction of the overall thermal budget for a wafer. In addition, using the powered pedestal results in high deposition rates in low pressure regimes. In certain embodiments, the AHMs deposited by the methods of the invention are suitable for use as etch stops. In addition, the AHMs are suitable for use with 193 nm and below lithography schemes.

Apparatuses for depositing films including ceramic pedestals are also provided. Ceramic wafer pedestals with multiple electrode planes embedded with the pedestal are also provided. According to various embodiments, the pedestals have multiple RF mesh electrode planes that are connected together such that all the electrode planes are at the same potential. The electrode planes may be configured to achieve improved plasma uniformity and deposition while conforming to pedestal geometry constraints. The electrodes may be grounded or powered. Also provided are methods of depositing films by PECVD methods using ceramic wafer pedestals with multiple electrode planes. Films that may be deposited using these pedestals include ashable hardmasks.

BRIEF DESCRIPTION OF THE DRAWINGS

FIG. 1 depicts various proposed mechanisms of increasing density and sp3 bond content using the certain embodiments.

FIG. 2 depicts important stages in a general process flow for a method of forming an ashable hard mask in accordance with the certain embodiments.

DETAILED DESCRIPTION OF THE INVENTION

Figure 3:
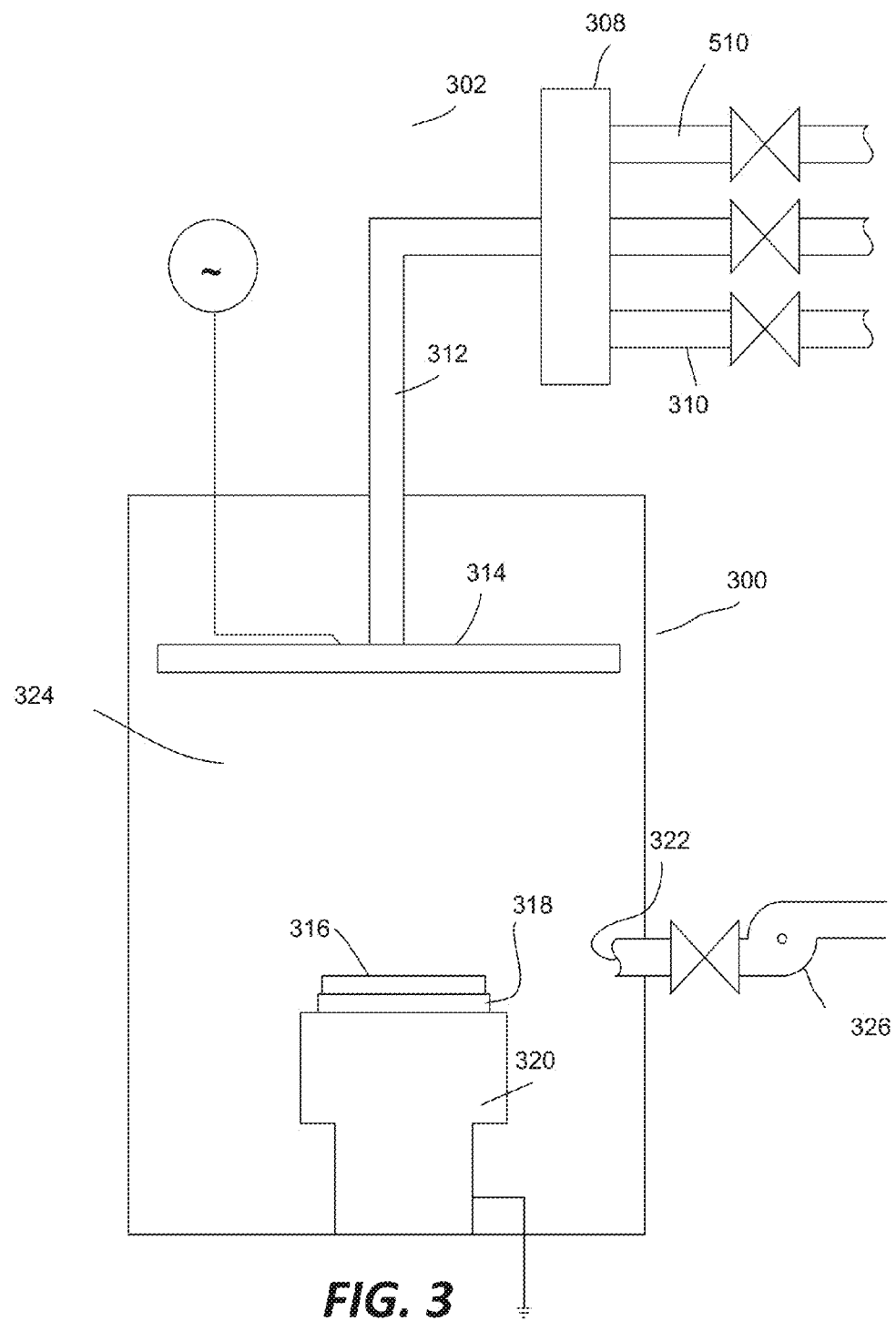
FIG. 3 is a simple diagram depicting a PECVD reactor that may be used to implement methods according to embodiments described herein.

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Introduction

Hard masks are used as etch stop layers in semiconductor processing. Ashable hard masks (AHM) have a chemical composition that allows them to be removed by a technique referred to as ashing once they have served their purpose. An ashable hard mask is generally composed of carbon & hydrogen with trace amount of one or more dopants (e.g., nitrogen, fluorine, boron, silicon). The bonding structure in these hard masks can vary from sp2 (graphite-like) to sp3 (diamond-like) or a combination of both, depending on the deposition conditions. In a typical application, after etching the hard mask has served its purpose and must be removed from the underlying dielectric oxide (e.g., $SiO_2$). This is generally accomplished, at least in part, by ashing, also referred to as "plasma ashing" or "dry stripping." Substrates with hard masks to be ashed, generally partially fabricated semiconductor wafers, are placed into a chamber under vacuum, and oxygen is introduced and subjected to radio frequency power which creates oxygen radicals (plasma). The radicals react with the hard mask to oxidize it to water, carbon monoxide, and carbon dioxide. In some instances, complete removal of the hard mask may be accomplished by following the ashing with additional wet or dry etching processes, for example when the ashable hard mask leaves behind any residue that cannot be removed by ashing alone.

To be used at etch stop layers, AHMs should have high etch selectivity so that the material being etched is removed faster than the AHM. In many applications, AHMs with etch selectivities of at least 15:1-20:1 (meaning the material being etched is removed 15-20 faster than the AHM during etching) are required. For example, 193 nm generation and below lithography schemes in particular require high selectivity of the hard mask to the underlying layers.

As indicated above, in many applications transparent AHMs are required. One measure of transparency is the extinction coefficient, k, a measure of the rate of extinction or diminution of electromagnetic radiation as it passes through the medium. For many applications, an extinction coefficient of around 0 indicates optical transparency and one around 1.3 indicates a very absorptive, almost opaque material. Extinction coefficients change according to the wavelength of the electromagnetic radiation. In many applications, AHMs having k values of at 0.1 or less at 633 nm are required. As transparency is inversely proportional to extinction coefficient times the film thickness, required extinction coefficient may depend on the film thickness. In a particular example, extinction coefficients at 633 nm of at or less than about 0.1 for a 5 kÅ AHM film are required.

Conventional methods for producing films having high etch selectivity (e.g., 15:1-20:1) rely on high temperature deposition processes. These processes produce highly graphitic and dense films having a carbon content around 80%. The dense and graphitic nature of the films drives down the etch rate of the AHM, increasing selectivity. However, because of the high sp2 content (sp2:sp3 ratio>2:1), these films do not have good transparency. For example, AHMs produced by high temperature deposition process have k-values of around 0.2-0.5 at 633 nm. Thus, they are not suited for use with mask alignment lasers at 633 nm.

Increasing the sp3 content makes the film diamond-like, increasing transparency. Lower temperature processes at typical PECVD operating conditions (e.g., temperature between about 300 and 400 C and relatively high precursor partial pressures around 5 Torr) may be used to produce films having carbon content around 60%. The resulting films have a significantly high sp3 fraction (typically for such films, NMR data show a sp2:sp3 ratio~1:1) and hence good transparency. However, these films are not dense and therefore have low etch selectivity.

The methods described produce films having good transparency and high etch selectivity without sacrificing high deposition rate.

As described in U.S. patent application Ser. No. 11/449, 983, depositing AHMs at low process temperatures and/or low precursor partial pressure allows AHMs having good transparency and high etch selectivity to be formed. Using relatively low temperatures results in transparent films. Lower temperatures prevent the film from graphitizing as well, resulting in films with high sp3 content (e.g., about 75%) and low extinction coefficients. Without being bound by a particular theory, it is believed that the using low partial precursor partial pressure results in increased density, thereby decreasing the etch rate and increasing the etch selectivity. Specifically, it is believed that low precursor partial pressure increases the number of non-depositing ions in the plasma relative to depositing radicals and that the resulting increased ion bombardment of the film facilitates compacting the film during its growth.

Low precursor partial pressure may be achieved by using a carrier gas having a high partial pressure. The carrier gas may be an inert gas such as helium, nitrogen, argon or a combination thereof. In some embodiments, hydrogen gas is used as the carrier gas. Using hydrogen as the carrier gas may further facilitate increasing the density of the film and creating high sp3 content by various reactive mechanisms. FIG. 1 shows several such possible mechanisms for surface reactions with a hydrocarbon precursor and hydrogen in a plasma. In the first mechanism, hydrogenation, carbon atoms from a hydrocarbon precursor are bound to the surface. The carbon atoms are bound to each other with a sp2 (double) bond. A hydrogen ion or radical bonds with one of the carbon atom, leaving a dangling bond on the other carbon and converting the sp2 (double) bond into sp3 (single) bonds. The second mechanism, abstraction, involves a hydrogen ion or radical abstracting a hydrogen atom bonded to the surface, forming hydrogen gas and leaving a dangling bond. As shown, the $CH_x$ precursor can then attach to the dangling bonds, reducing hydrogen content and increasing film density. In another abstraction mechanism not shown, a surface $CH_x$ is removed by a hydrogen ion or radical, forming a dangling bond. These mechanisms facilitate creating dense films that have high sp3 bond content. NMR data typically show a sp2:sp3 ratio<1:3 for films produced by these methods.

FIG. 2 depicts important stages in a general process flow for a method of forming an ashable hard mask in accordance with the present invention. The method (200) begins by providing a semiconductor device substrate in a deposition chamber (202). A process gas comprising a hydrocarbon precursor gas is introduced to the chamber at low partial pressure (204). Partial pressure of the precursor gas is between about 0.01-4 Torr. In certain embodiments the partial pressure is between about 0.01 and 0.1 Torr, and in specific embodiments, between 0.05 and 0.5 Torr, and 0.05 and 0.1 Torr.

The hydrocarbon precursor may be, for example, one defined by the formula $C_xH_y$, wherein X=2 to 10 and Y=2-24. Specific examples include methane, acetylene, ethylene, propylene, butane, cyclohexane, benzene and toluene and ($CH_4$, $C_2H_2$, $C_2H_4$, $C_3H_6$, $C_4H_{10}$, $C_6H_6$, $C_6H_{12}$ and $C_7H_8$, respectively). Acetylene is a preferred precursor in many applications.

As discussed above, a carrier gas may be used to dilute the precursor flow. The carrier gas may be any suitable carrier gas, including helium, argon, nitrogen, hydrogen, or a combination of any of these.

An ashable hard mask is deposited on the substrate by a PECVD process wherein the process (substrate) temperature is below 500 C (206). In some embodiments, the process temperature is below about 400 C, for example, between about 30 and 400 C. In some embodiments, the process temperature is below about 300 C, for example between about 30 and 300 C. In particular embodiments, the process temperature is between about 50 and 250 C, e.g., between 150 and 250 C.

Operation 206 is continued until the desired thickness of film is deposited. According to various embodiments, between about 1000 and 9000 angstroms is deposited.

Chamber pressure may be any suitable pressure. In conventional AHM deposition processes, pressure is typically 5-10 Torr. In particular embodiments of the present invention, the total chamber pressure may be lower than conventionally used. For example, it may range from 1-2 Torr. In embodiments wherein hydrogen is used as the carrier gas, hydrogen flow rate typically ranges from 1000-25000 sccm According to various embodiments, the methods of the present invention produce AHMs having etch selectivity of between about 15:1-20:1 relative to underlying dielectric and metal barrier layers. Also according to various embodiments, the highly selective AHMs are transparent at 633 nm. In certain embodiments, the AHMs have extinction coefficients less than or equal to about 0.1 at 633 nm. Acceptable k values may depend on AHM film thickness, with thicker films requiring lower extinction coefficients. In a particular embodiment, an AHM of 5000 angstroms having a k of no more than about 0.1 is deposited. In another embodiment, an AHM of 9000 angstroms having a k of no more than about 0.05 is deposited.

FIG. 3 provides a simple block diagram depicting various reactor components that may be used to implement the methods described above. As shown, a reactor 300 includes a process chamber 324, which encloses other components of the reactor and serves to contain the plasma generated by a capacitor-type system including a showerhead 314 working in conjunction with a grounded heater block 320. A high-frequency RF generator and a low-frequency RF generator—both indicated at 304—are connected to showerhead 314. The power and frequency supplied by the generators is sufficient to generate a plasma from the process gas, for example 100-2500 W per station total energy. In a typical process, the high frequency RF component is generally between 2-60 MHz; e.g., 13.56 MHz. The LF component can be from 100 kHz-2 MHz; e.g., the LF component is 400 kHz Within the reactor, a wafer pedestal 318 supports a substrate 316. The pedestal typically includes a chuck, a fork, or lift pins to hold and transfer the substrate during and between the deposition and/or plasma treatment reactions. The chuck may be an electrostatic chuck, a mechanical chuck or various other types of chuck as are available for use in the industry and/or research.

The process gases are introduced via inlet 312. Multiple source gas lines 310 are connected to manifold 308. The gases may be premixed or not. Appropriate valving and mass flow control mechanisms are employed to ensure that the correct gases are delivered during the deposition and plasma treatment phases of the process. In case the chemical precursor(s) is delivered in the liquid form, liquid flow control mechanisms are employed. The liquid is then vaporized and mixed with other process gases during its transportation in a manifold heated above its vaporization point before reaching the deposition chamber.

Process gases exit chamber 300 via an outlet 322. A vacuum pump 326 (e.g., a one or two stage mechanical dry pump and/or a turbomolecular pump) typically draws process gases out and maintains a suitably low pressure within the reactor by a close loop controlled flow restriction device, such as a throttle valve or a pendulum valve.

Operating with low precursor partial pressures (e.g., 0.05-0.5 Torr) and relatively low temperature (e.g., less than about 400 C) results in the deposition of highly selective AHM films. However, deposition rates for these processes in conventional PECVD apparatuses may be low—on the order of 100-1000 Å/min. Increase in deposition rate comes at the expense of etch selectivity.

Figure 4:
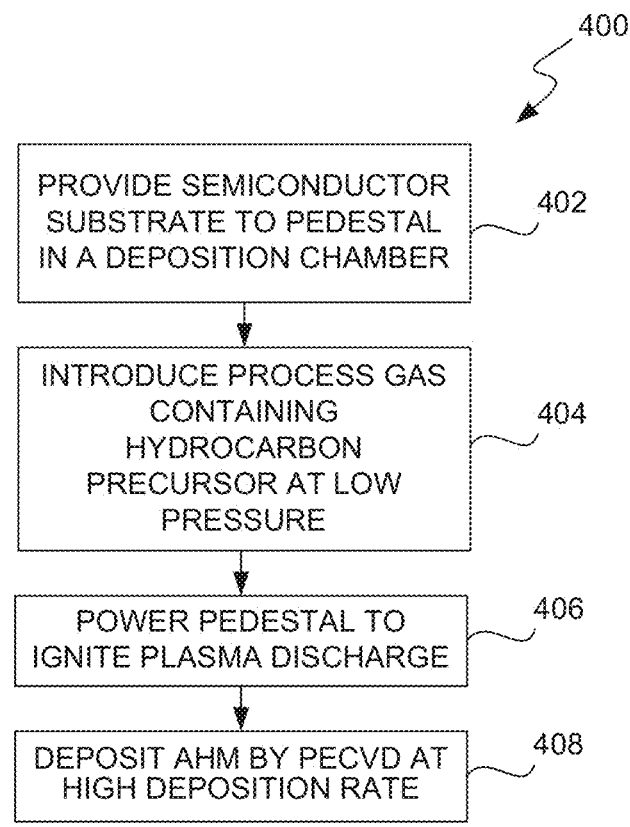
FIG. 4 depicts important stages in a general process flow for a method of forming an ashable hard mask in accordance with certain embodiments.

In certain embodiments, methods and apparatuses are provided to deposit AHMs having increased selectivity at high deposition rates. FIG. 4 is a process flow sheet showing stages in a general process flow for methods of forming transparent ashable hardmasks. The method (400) begins by providing a semiconductor device substrate in a deposition chamber (402). A process gas comprising a hydrocarbon precursor gas is introduced to the chamber at low hydrocarbon precursor gas partial pressure (404). Overall pressure is also low compared to conventional processes. Unlike conventional PECVD chambers in which the showerhead is powered to ignite the plasma, the pedestal is powered to ignite the plasma discharge (406). (It should be noted that the order of operations 404 and 406 may be reversed or the operations may be concurrent). The showerhead is the grounded electrode. The AHM is then deposited by plasma enhanced chemical vapor deposition (408). The process illustrated allows a high deposition rate, e.g., above about 1500 Å/min, in certain embodiments, at about 5000-15000 Å/min. Typical flow rates of the hydrocarbon precursor could range from about 1500 sccm for 1500 A/min deposition to about 6000 sccm for 15000 A/min deposition.

Using the methods described in FIG. 4, a highly selective and transparent AHM may be deposited at low temperature—process conditions may be as described above with reference to FIG. 2, though in certain embodiments, the methods described in FIG. 4 may be used for deposition of AHMs at other process conditions, e.g., at higher temperature. As described further below, the methods may be used in other low pressure plasma deposition processes to optimize plasma confinement and increase deposition rate. In certain embodiments, the methods described in FIG. 4 exploit asymmetric discharge that results from operating at low pressure to increase ion flux density and ion energy at the surface of the wafer—increasing deposition rate and film compaction.

Plasma confinement in a chamber depends on pressure×distance scaling. Ideally in a PECVD or other plasma deposition chamber, the plasma forms and is confined to the region above the wafer. The breakdown voltage—i.e., the ease of forming a plasma—depends on the pressure and the distance between the powered electrode and the other surfaces between which a plasma may form. The lower the breakdown voltage, the more plasma formation is favored. PECVD chambers with chandelier showerheads require fairly large gaps between the chamber surfaces (~3 inches) and a smaller gap between the showerhead and the pedestal (~0.5 inches) to exploit pressure×distance scaling. At conventional pressures (e.g., >6 Torr total pressure for acetylene based AHM deposition) the pedestal is the grounded electrode and the plasma is well-confined between the showerhead and the pedestal in these chambers. However, because breakdown voltage has a non-linear dependence on pressure×distance scaling, at lower pressures, e.g. <about 1 or 2 Torr total pressure, in the same geometry, plasma is not confined between the narrow gaps and also forms in the regions between the showerhead and chamber surfaces—the grounded electrode includes these chamber surfaces.

In addition to the plasma being well-confined, operating at high pressure in a conventional PECVD chamber results in a symmetric discharge. In symmetric discharges, the area of the grounded electrode is the same as the area of the powered electrode and the voltage drop across the powered electrode plasma sheath (the dead region that surrounds any surface in contact with the plasma) is the same as that across the grounded electrode. As both electrodes see the same sheath, ion bombardment on either electrode is similar. The resulting films on the electrodes are expected to be deposited with a similar deposition rate and have a similar density. However when the discharge is operated at low pressure in the same chamber, the plasma expands to the deadzones of the reactor, e.g., the regions between the showerhead and the chamber walls, the regions between the showerhead and other non-pedestal surfaces. In this scenario, the discharge is asymmetric—the area of the grounded surfaces (chamber walls as well as pedestal) is much greater than the area of the showerhead and the showerhead has a larger sheath and voltage drop across the sheath. The larger sheath near the showerhead compared to the pedestal results increased ion bombardment on the showerhead. A wafer placed on the grounded pedestal in such a reactor with asymmetric discharge sees smaller ion flux density and lower ion energy. Since ions participate in deposition by creating dangling bonds on which incoming radicals can physisorb or chemisorb, as well participate in film compaction, the deposition rate and density of the AHM films deposited on the wafer is relatively low.

According to various embodiments, PECVD methods involving depositing layers using a powered pedestal PECVD apparatus are provided. Placing the wafer on a powered pedestal and operating at low pressures reverses the asymmetric situation described above: the pedestal (and the wafer on the pedestal) sees a higher ion flux and higher ion energy than the showerhead. This results in higher in increased deposition rate as well as greater film compaction. In addition, in certain embodiments, it may be useful to supply power to both electrodes.

It should be noted that the pressure regime at which the asymmetric discharge resulting from use of a powered pedestal improves film compaction and deposition rate (as described above) is chemistry dependent. In general, the advantages are realized at lower pressures than commonly used in PECVD reactions, e.g., less than less than about 4 Torr, for example less than about 2 Torr or 1 Torr. For acetylene-based AHM deposition, the pressure may range from about 0.5-2 Torr total pressure, for example. Also, in certain embodiments, the LF:HF ratio may be high, e.g., 5:1 to 20:1. High LF:HF ratio is used to aid densification of the film for high etch selectivity in low temperature/low pressure process regimes. Increasing the LF:HF ratio increases ion energies as well increases the ions to depositing flux ratio. Both aid in film densification. However, increasing the ratio also increases the extinction coefficient. Thus, in some embodiments an optimal ratio of 5:1 to 10:1 is used to keep the film transparent (k @ 633<0.10).

Apparatus

Figure 5:
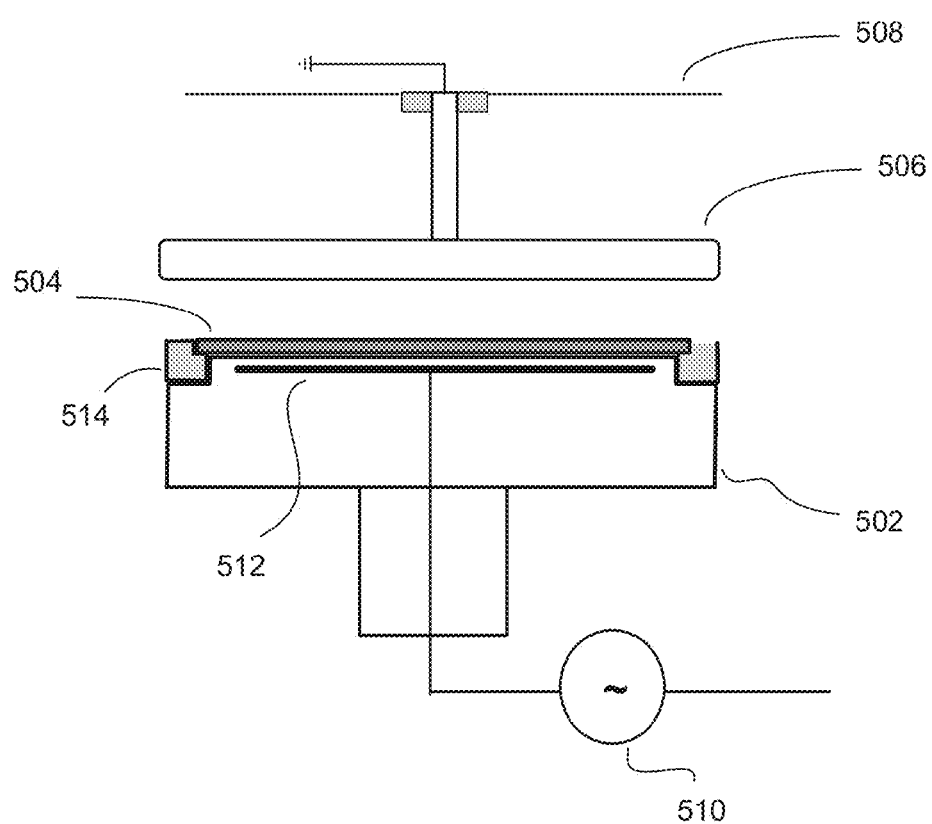
FIG. 5 is a simple diagram depicting a powered pedestal PECVD reactor according to certain embodiments.

FIG. 5 provides a simple block diagram depicting components of a PECVD apparatus that may be used in accordance with the methods described above with reference to FIG. 4. (Certain components of the PECVD reactor, such as the reactor walls, gas inlets, etc. are not shown for simplicity's sake). A plasma is generated by a capacitor-type system with HF and LF RF generators (indicated at 510) connected to pedestal 502. Showerhead 506, through which gases are inlet, and top plate 508 are grounded. Wafer or other substrate 504 rests on ring 514. In certain embodiments, ring 514 is a ceramic carrier ring that in addition to holding the wafer also aids in focusing the plasma to the desired area above the wafer. Although not depicted in the figure, the pedestal also typically contains a heater. This heater is isolated from the RF mesh electrode described below. The pedestal may be made of any material that withstands high temperature and is inert to the chemical environments. Ceramic, e.g., aluminum nitride and boron nitride are examples of appropriate materials.

In certain embodiments, the pedestal is powered using a RF mesh, such as RF mesh 512. The RF mesh is embedded in the pedestal and RF power is delivered to it. The RF mesh lies fairly close to the pedestal surface such that the plasma is generated and confined between the grounded showerhead and the pedestal. According to certain embodiments, the backside of the RF mesh is enclosed in a thick insulation, e.g., ceramic insulation, which aids in reducing the formation of parasitic plasma at the chamber bottom surfaces. The thick ceramic material provides a high impedance path on the back side of the powered RF mesh for low frequency RF power. In conventional reactors where aluminum showerheads are powered, there is no such hindrance for RF power preventing it from coupling to the chamber top surface. The powered pedestal reactor also results in reduced parasitics in other deadzones of the reactor because the powered electrode is further from the chamber walls than a powered showerhead in a conventional reactor is. The RF mesh should be close to the wafer surface for good deposition rate—this may mean that in certain embodiments, such as that depicted in FIG. 5, the RF mesh is not below the carrier ring.

In certain embodiments, a pedestal having multiple RF electrode planes is provided. The electrode planes are connected together, internal or external to the ceramic, such that all electrode planes are at the same potential. The electrodes may be grounded or RF powered. Current RF electrode pedestals are either made from aluminum or a ceramic material with a single RF electrode plane embedded within the ceramic material.

Unlike aluminum pedestals in which the pedestal material itself acts as the electrode, a separate electrode is required with ceramic pedestals for plasma formation. Conventional ceramic pedestals are manufactured with a single planar electrode material embedded within the ceramic. The single plane RF electrode does not allow for certain geometry features without compromising either the electrode size or the distance from the pedestal surface. For example, to increase deposition rate, an electrode may be placed closed to the pedestal top surface. However, in pedestals in which pedestal geometry requires an annular recess, for example, to fit a carrier ring, the electrode diameter is smaller than the wafer diameter. See FIG. 6, for example, in which pedestal 601 supports wafer 603. Heater element 607 is used to heat the wafer. Electrode 603 is an RF mesh, which may be powered or grounded. Pedestal 601 has sections of two diameters: main pedestal body section 601a and mesa-shaped section 601b that supports the wafer. The pedestal geometry is such that an annular recess 602 at the surface of the pedestal allows placement of a carrier ring (not shown) used to transport the wafer to and from the pedestal. Because of the annular recess, the electrode 605 has a smaller diameter than wafer 603. The arrangement shown in FIG. 6 results in plasma edge effects—the plasma intensity is lower at the edge of the wafer, which leads to non-uniformity in the deposited film. Plasma edge effects can be mitigated with a larger diameter electrode, however due to the geometry constraints imposed by the carrier ring, the electrode would be located in section 601b, further away from the wafer, thereby compromising deposition rate.

Figure 6:
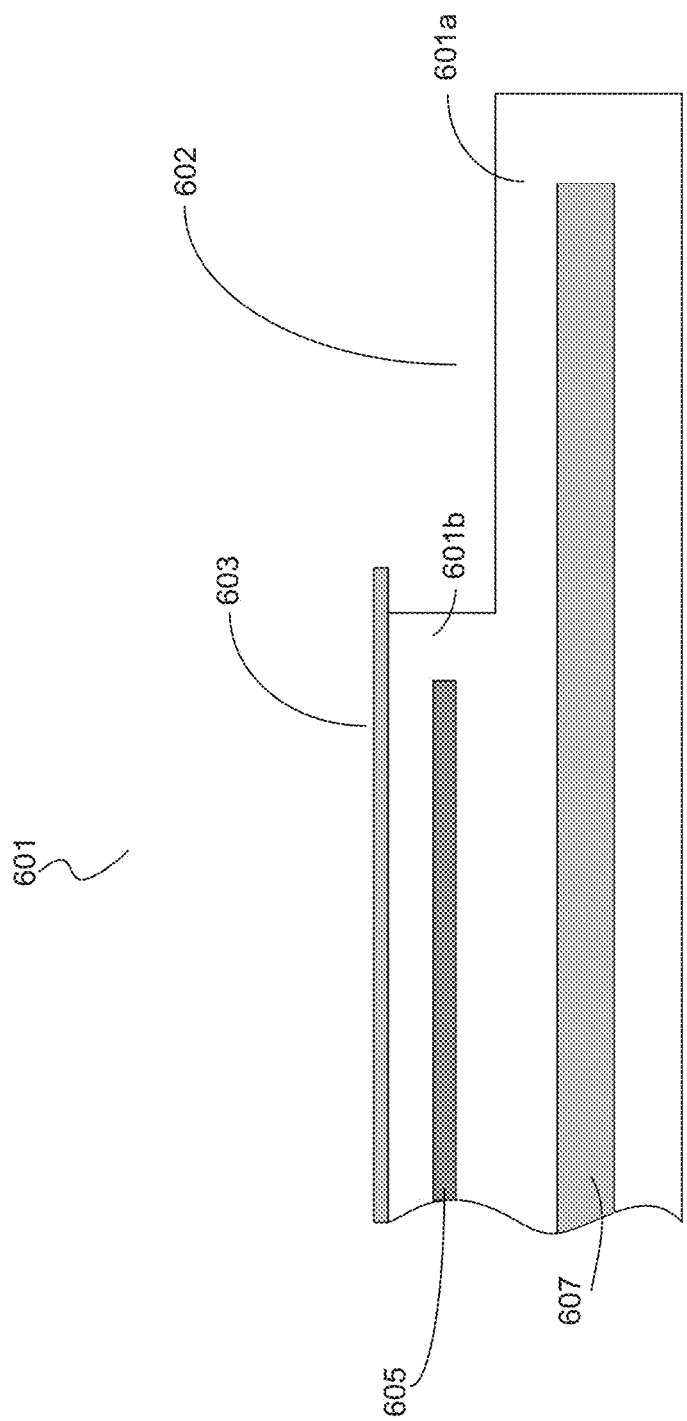
FIG. 6 is a simple diagram depicting a single RF mesh pedestal.
Figure 7:
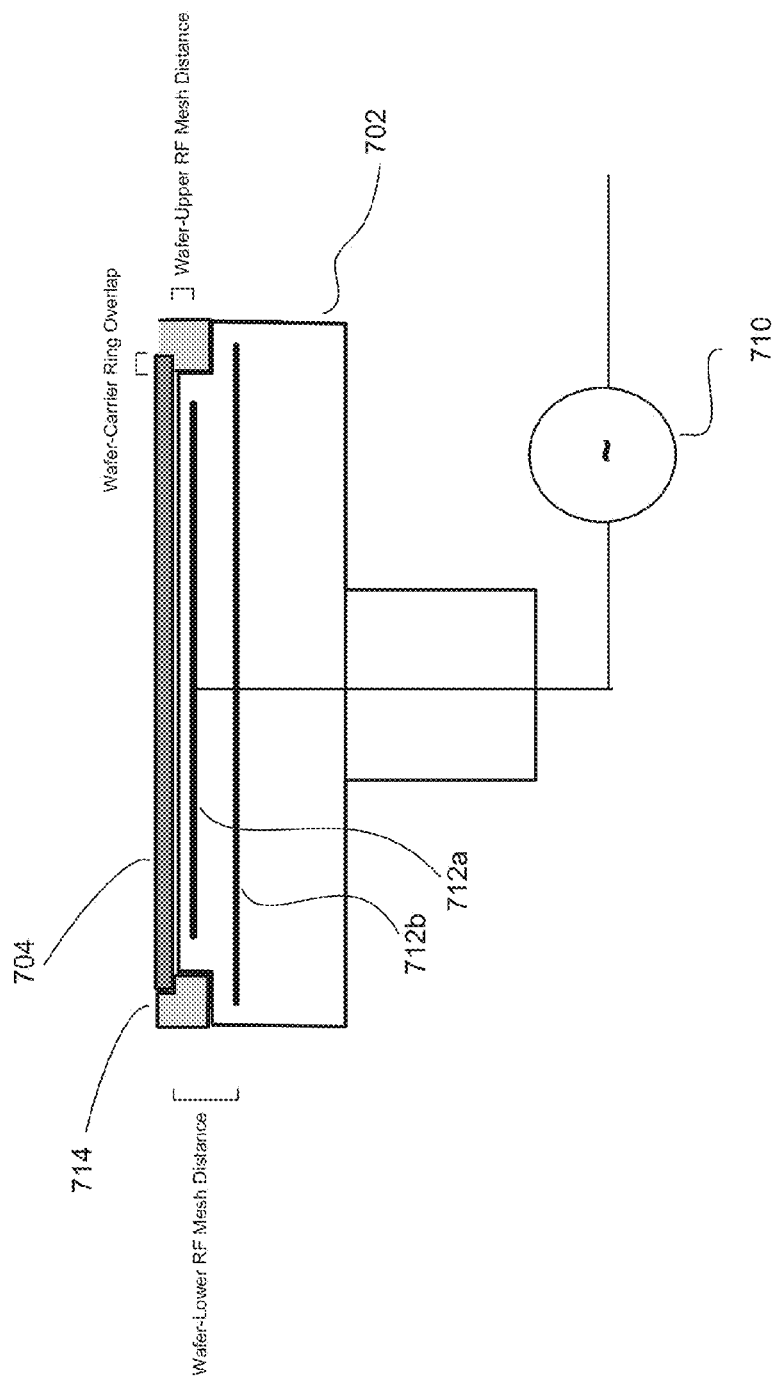
FIGS. 7-9 are a simple diagram depicting multiple RF mesh pedestals according to certain embodiments.

The multiple connected electrode plane pedestals according to certain embodiments provide good plasma and deposition uniformity across the wafer, while providing high deposition rates. FIG. 7 shows an example of a pedestal having multiple electrode planes according to certain embodiments. In this example, two RF meshes, upper RF mesh 712a and lower RF mesh 712b, are embedded in pedestal 702. LF and HF RF power is supplied to the meshes as indicated at 710. Upper RF mesh 712*a* is located at a plane slightly below the wafer surface. The ceramic carrier ring 714, which carries the wafer 704 between stations, sits below the wafer surface when wafer is placed on the pedestal. (The height of the carrier ring can be varied so that when the wafer is the placed on the pedestal and off the carrier ring, the wafer surface may be above, below or flush with the top surface of the carrier ring depending on carrier ring height. This aids in adjusting the film uniformity at the edge of the wafer.) Lower RF mesh 712*b* is extends under the carrier ring, extending as far as or further than the wafer diameter. The dual RF mesh pedestal results in uniform deposition without sacrificing deposition rate. Lower RF mesh 712*b* results in good plasma uniformity and good deposition uniformity at the wafer edge. Upper RF mesh 712*a* results in a high ion flux density and energy at the surface. Three dimensions are indicated in FIG. 6: wafer-carrier ring overlap, wafer—upper mesh distance and wafer—lower mesh distance. Examples of these dimensions are:

Wafer—carrier ring overlap: ~50 mils
Wafer—upper mesh distance: ~0.05+/−0.02 inches
Wafer—lower mesh distance: ~0.15+/−0.05 inches One of skill in the art will appreciate that these ranges may vary depending on a number of factors including total RF power used.

The electrode planes may be made of any appropriate electrode material. In general, electrodes in ceramic are typically made of a mesh that is pressed into the ceramic; however, the multiple electrode plane pedestals are not so limited and include any appropriate electrode, e.g., each electrode plane may be a thin film. The embedded electrodes may be grounded or powered. As indicated, each RF mesh or other electrode plane is at the same potential, such that the plasma forms between the upper electrode (e.g., showerhead or other upper electrode) and the pedestal as appropriate. The electrode material typically has a coefficient of thermal expansion close to that of the ceramic. For example, molybdenum electrodes are suitable in some aluminum nitride ceramic pedestals.

The dual RF mesh pedestal in FIG. 7 has a geometry that accommodates a wafer carrier ring; multiple electrode planes may also be used in pedestal having other geometry constraints. For example, pedestals having two differently sized and/or shaped sections (such as section 701*a* and 701*b*) may advantageously have two electrode planes. In particular embodiments, the multiple electrode planes may be used in pedestals in which a section of the pedestal closer to the wafer does not have the space or is not otherwise able to accommodate an electrode that provides coverage that encompasses the projection of the wafer onto the pedestal.

Figure 8:
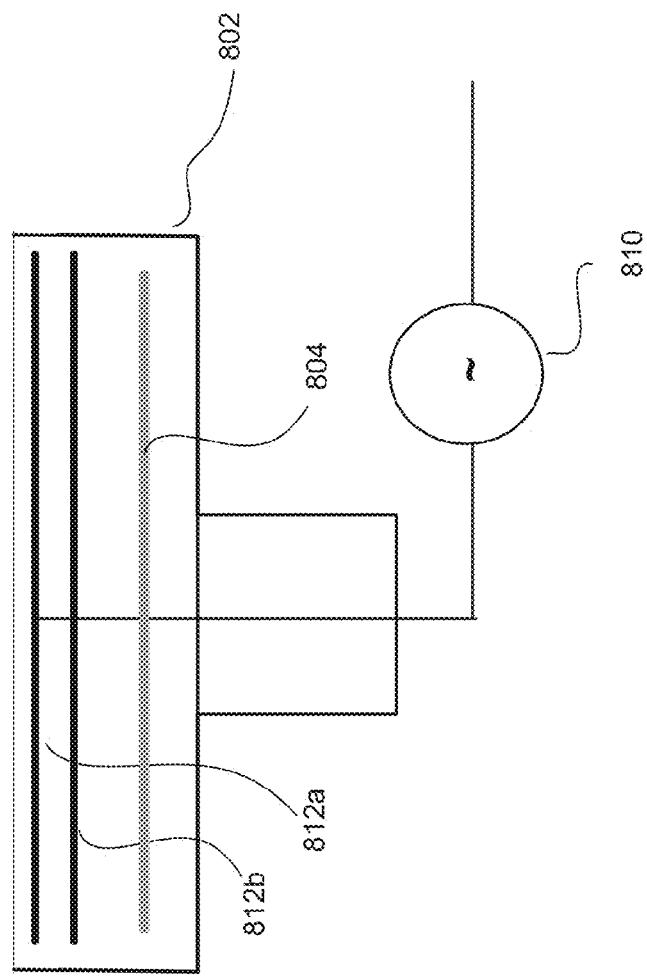

Multiple electrode planes may also be advantageously used in ceramic pedestals that do not have the geometry constraints imposed by carrier rings or other considerations. Such a pedestal is shown in FIG. 8. Here, two RF meshes, upper RF mesh 812*a* and lower RF mesh 812*b*, are embedded in pedestal 802. Power is supplied to power is supplied to the meshes as indicated at 810, though as indicated above, in other embodiments they may be grounded. Although not shown, a wafer may rest directly on the pedestal or on a support such as lift pins. Upper RF mesh 812*a* is located at a plane slightly below the wafer surface. In this embodiment, the pedestal geometry allows the upper RF mesh 812*a* to be coextensive with the lower RF mesh 812*b*. However, lower RF mesh is positioned to improve shielding of heater element 814 embedded in the ceramic in order to minimize RF noise on the heater element. This same benefit of shielding RF noise on a heater is realized in the embodiment in FIG. 7, where a heater element would be located below lower RF mesh 712*b*.

Figure 9:
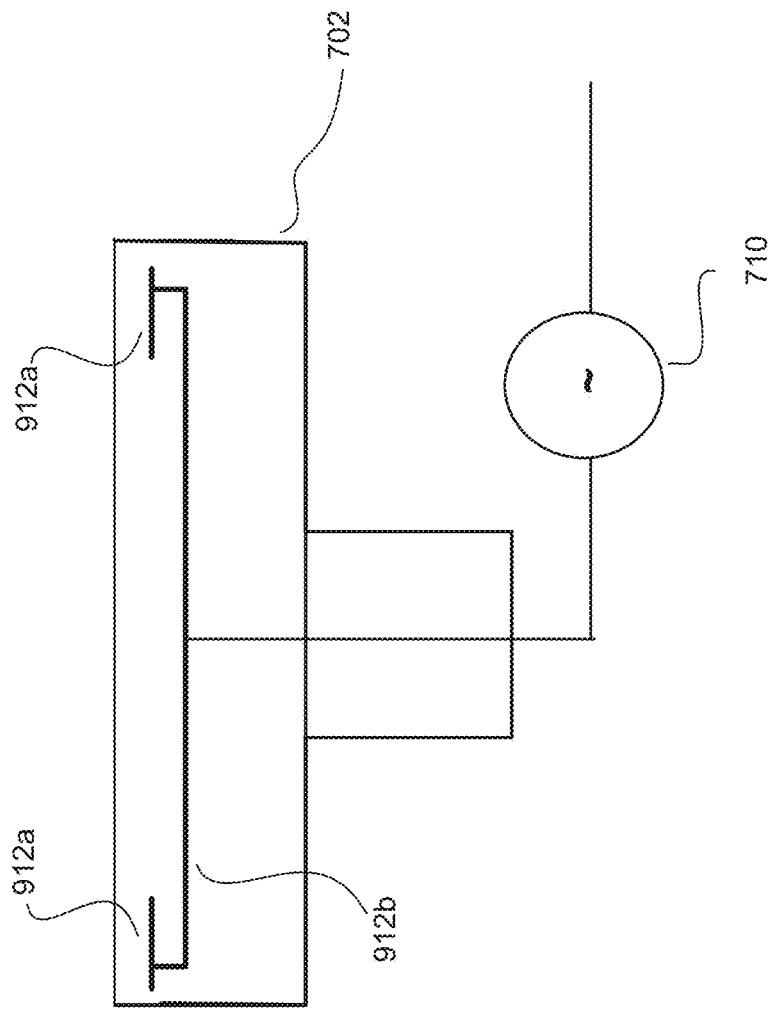

Other arrangements of multiple electrode planes may be used in pedestals to obtain desired plasma formation. FIG. 9, for example, shows an embodiment in which the upper electrode plane 912*a* is an annular ring (shown in cross-section), while lower electrode plane 912*b*. This type of arrangement may be useful to increase edge deposition rate. In other embodiments, the pedestal may have more than two such planes, each electrode plane having the same general shape of same or different sizes or different shapes as necessary to shape the plasma as desired.

Methods of depositing films using multiple electrode plane ceramic pedestals are also provided. The methods involve introducing a process gas into a chamber housing the pedestal and igniting a plasma to deposit a film on a wafer supported by the pedestal by a PECVD process. Igniting a plasma involves powering the multiple plane pedestal electrode and/or an upper electrode (e.g., a showerhead). Plasma is then generated between the wafer and the upper electrode as described above. In particular embodiments, the methods are high-temperature processes for which aluminum pedestals not suited.

Figure 11A:
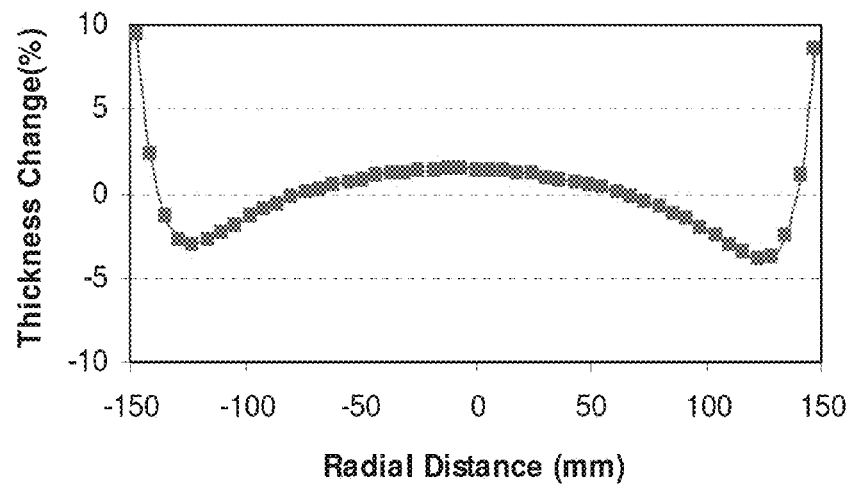
FIGS. 11A-11B are plots showing deposition uniformity across a wafer using single RF plane pedestals.
Figure 11B:
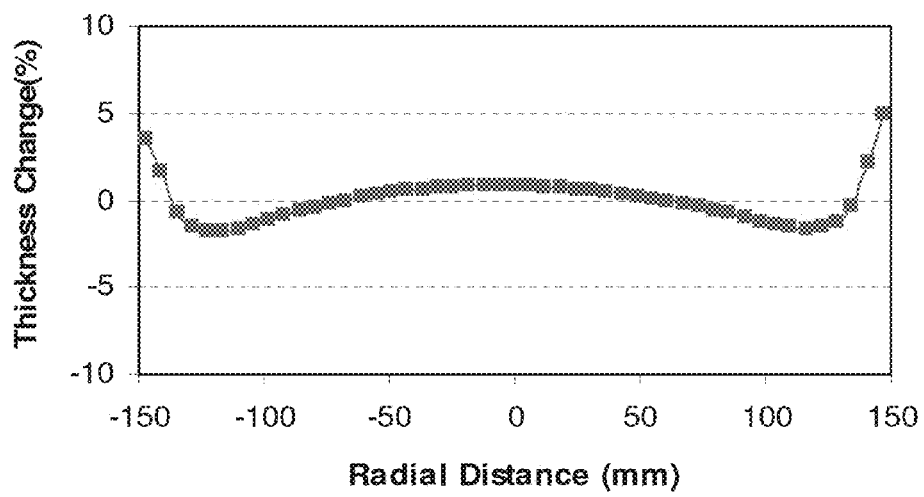
Figure 11C:
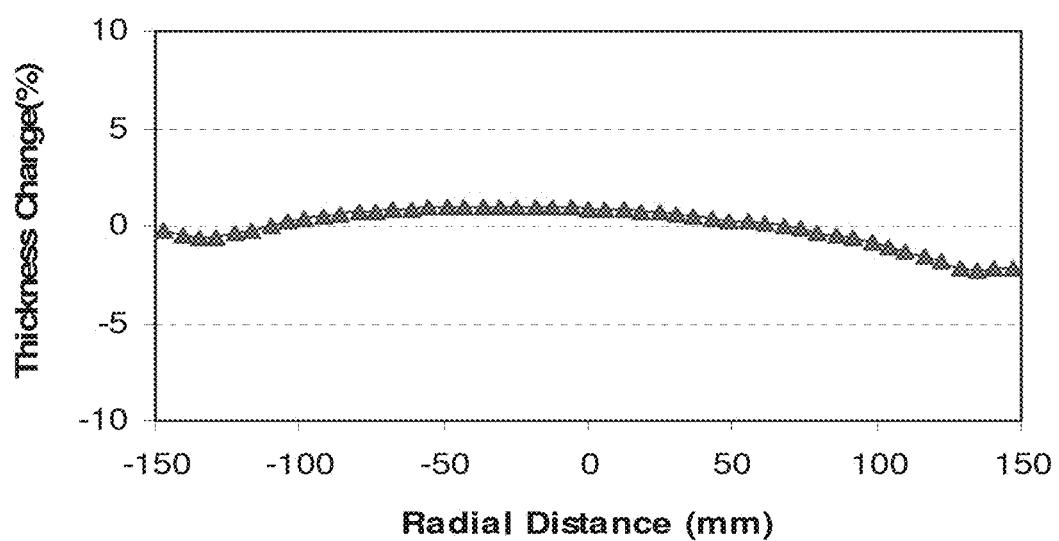
FIG. 11C is a plot showing deposition uniformity across a wafer using a dual plane RF pedestal.

FIGS. 11A-C shows deposition uniformity plots for deposition using 3 different pedestals. FIGS. 11A and 11B shows deposition uniformity on pedestals having a single RF plane: FIG. 11A having a high RF plane and FIG. 11B having a low RF plane. FIG. 11C shows deposition uniformity on a pedestal having dual RF planes. As can be seen from the FIGS. 11A-C, results are as follow:

| Pedestal Type | Uniformity |
|---|---|
| Single RF grid (RF plane high) | Poor |
| Single RF grid (RF plane low) | Poor |
| Dual RF grid | Good |

EXAMPLES

The following examples are provided to further illustrate aspects and advantages of the present invention. These examples are provided to exemplify and more clearly illustrate aspects of the present invention and are in no way intended to be limiting.

Figure 10:
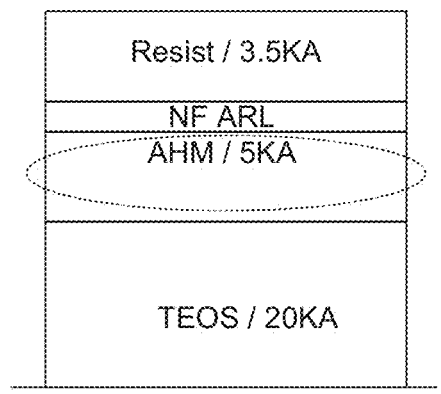
FIG. 10 shows a rough schematic of a dielectric/AHM/ARL/photoresist film stack.

FIG. 10 shows a rough schematic of a dielectric/AHM/ARL/photoresist film stack. In the stack shown in FIG. 10, a 5000 angstrom AHM overlies a 20,000 angstrom layer of dielectic material (TEOS) on a silicon substrate. A nitrogen free anti-reflective layer (NF ARL) is overlies over the AHM and photoresist overlies the NF ARL. The stack shown in FIG. 10 is just an example of a stack in which an AHM may be employed. In an example application, the portion of the dielectric to be etched is unprotected by the AHM (not shown). The photoresist is patterned and an etch process performed to define the desired features down to the AHM (etch stop) and to etch the unprotected dielectric to define the features in the dielectric. The AHM is then ashed as discussed above.

Film stacks as shown in FIG. 7 using various AHMs were formed. An ARL/AHM open etch was performed, and then a main oxide etch. An oxygen dominated etch chemistry was used for the ARL/AHM open etch and a $C_4F_6/C_4F_8/O_2/Ar$ chemistry was used for the oxide etch. The following AHMs were formed, and etch selectivity and extinction coefficient was measured for each as shown in Table 1:

TABLE 1

Selectivity and Extinction Coefficient of Various AHMs

| | Temp (°C.) | $C_2H_2$ flow (sccm) | $H_2$ flow (sccm) | He flow (sccm) | $N_2$ flow (sccm) | Pressure (Torr) | $C_2H_2$ Partial Pressure (Torr) | Feature Top Selectivity | k @ 633 nm |
|---|---|---|---|---|---|---|---|---|---|
| 1 | 150 | 750 | 13500 | 0 | 0 | 1.5 | 0.08 | 17.5 | 0.06 |
| 2 | 150 | 1250 | 13500 | 0 | 0 | 1.5 | 0.12 | 13.5 | 0.04 |
| 3 | 150 | 2000 | 7500 | 0 | 0 | 1.5 | 0.32 | 12 | 0.02 |
| 4 | 400 | 6750 | 0 | 13500 | 1500 | 8 | 2.48 | 11 | 0.03 |
| 5 | 550 | 2500 | 0 | 12000 | 1000 | 6 | 0.97 | 15 | 0.39 |

Feature top selectivity is one of the several different ways of measuring AHM etch selectivity. Feature top selectivity is calculated as $$\frac{OxideThickness_{Etched}}{\left(AHM\ Thickness_{Deposited} - AHM\ Thickness_{after\ Etch(at\ the\ top\ of\ the\ feature)}\right)}$$

Other process conditions for AHMs 1-3 include the HFRF and LFRF power and frequency. HFRF power was 200 W and HFRF frequency was 13.56 MHz for the above processes. LFRF power was 2400 W and LFRF frequency was 400 kHz for the above processes. AHMs 4-5 used HF=400 W & LF=1200 W.

AHMs 1-3 were produced according to certain embodiments of the present invention, i.e., at low temperature and low $C_2H_2$ partial pressure. All of these AHMs have selectivity of at least 12:1 and k of less than 0.1. AHM #4, produced at 400 C and 8 Torr (2.5 Torr $C_2H_2$ partial pressure) also has good transparency, though lower selectivity than the AHMs produced at lower pressure. AHM #5, produced by a high temperature process, had a high selectivity, 15:1, but is not transparent, with an extinction coefficient of almost 0.4.

As can be seen from comparing AHMs 1-3 in Table 1, selectivity improves as the partial pressure is decreased, with the highest selectivity/low temperature AHM formed using a $C_2H_2$ partial pressure of 0.08. It is believed this is a result of lower partial pressure causing increased densification of the film. As can be seen from comparing AHMs 1-3 to AHM #5, lower temperature results in better transparency. It is believed that this is because lower temperature prevents the film from graphitizing; the films are thus dominated by sp3 bonds and have good transparency.

AHMs A-G were also produced at various process conditions, with composition, transparency and density as shown in Table 2. AHM A was produced at 400 C, with HFRF prower. AHMs B, C and D were produced at 550 C, with process conditions for B the same as for AHM #5 in Table 1. A nitrogen-free process for AHM C was used, with C2H2/H2/He flowrates of 2000/3500/13500 sccm, HFRF/LFRF powers of 200/1200 W, and a pressure of 4 Torr. The process conditions for D the same as for AHM #5 except using high LFRF. AHMs E, F and G were produced as for AHMs #1-3 in Table 1, at low temperature (150 C) with low $C_2H_2$ partial pressure, $H_2$ flows of 7500-13500 sccm, and a total pressure of 1.5 Torr. Process conditions for AHMS A-G are summarized below:

A: 400 C, C2H2/H2 flow of 2000/9000 sccm, HFRF/LFRF=2000/400 W, pressure of 6 Torr
B: 550 C, conditions as for #5, Table 1
C: 550 C, C2H2/H2/He flows of 2000/3500/13500 sccm, HFRF/LFRF powers of 200/1200 W and pressure of 4 Torr
D: 550 C, High LFRF of 2400 W (600 W per station). All other conditions same as AHM #5, Table 1
E: conditions as for #1, Table 1
F: conditions as for #2, Table 1
G: conditions as for #3, Table 1

Composition, density, stress and transparency were determined for each of the AHMs and are shown in Table 2.

TABLE 2

Composition, density and transparency of various AHMs

| | A | B | C | D | E | F | G |
|---|---|---|---|---|---|---|---|
| Composition (H:C:N) | 43:56:00 | 20:79:0.2 | 14:86:00 | 21:77:00 | 41:59:00 | 43:53:00 | 46:54:00 |
| Density (g/cc) | 1.03 | 1.45 | 1.54 | 1.26 | 1.29 | 1.16 | 1.14 |
| Stress (E9 dynes/cm$^2$) | 0.4 | 0.2 | 0.6 | 0.4 | −5 | −3.9 | −3.9 |
| Transparency (k at 633 nm) | 0.06 | 0.39 | 0.46 | 0.38 | 0.06 | 0.4 | 0.02 |

AHMs E-G in Table 2 were produced according to certain embodiments of the present invention, i.e., at low temperature and low precursor partial pressure. Carbon content is between about 50-60% for these films, similar to the carbon content of AHM A, which was produced at 400 C. However, the density is superior to AHM A. Note that he transparency of all high temperature processes is unacceptably high for mask alignment lasers.

Powered Pedestal Examples

AHMs were deposited using standard and powered pedestal (dual RF mesh) PECVD chambers using the following conditions:

Gas: 4000 sccm $C_2H_2$/1600 sccm He
HFRF power: 1000 W
LFRF power: 300 W

Total pressure: 1 Torr
Temperature: 400 C

The chambers were substantially the same, with the exception of which electrode was powered. The standard PECVD chamber used was a Vector™ reactor chamber available from Novellus Systems, Inc., San Jose, Calif. Deposition rate, % non-uniformity of the film thickness, refractive index (n) at 633 nm, and transparency (k) at 633 nm were measured for each process:

TABLE 3

Powered Pedestal Deposition Rate

| Chamber | Deposition Rate at wafer center (Å/min) | Non-uniformity % | n @ 633 nm | k @ 633 nm |
|---|---|---|---|---|
| Standard PECVD chamber (powered showerhead/grounded pedestal) | 800 | 10.0 | 1.78 | 0.06 |
| Powered Pedestal PECVD chamber | 4200 | 7.7 | 1.93 | 0.20 |

Using the powered pedestals resulted in an almost fivefold deposition rate increase. The refractive index, n, is an indicator of film density and selectivity. In the example shown in Table 3, the refractive index is nearly 2 for the film deposited with a powered pedestal. A refractive index of about 2 indicates an etch selectivity of >about 15:1. Uniformity of the film can be improved by optimizing the process regime both with respect to flow and power ratio.

AHMs were deposited using standard and powered pedestal (dual RF mesh) PECVD chambers using the following conditions:
Gas: 3000 sccm $C_2H_2$/2500 sccm He/1500 $H_2$
HFRF power: 100 W
LFRF power: 600 W
Total pressure: 1 Torr or 1.5 Torr (see Table 4)
Temperature: 350 C
Deposition rate, % non-uniformity of the film thickness, refractive index (n) at 633 nm, and transparency (k) at 633 nm were measured for each process:

TABLE 4

Powered Pedestal Deposition Rate

| Chamber | Total Pressure (Torr) | Deposition Rate at wafer center (Å/min) | Non-uniformity % | n @ 633 nm | k @ 633 nm |
|---|---|---|---|---|---|
| Standard PECVD chamber (powered showerhead/ grounded pedestal) | 1 | 1250 | 2.3 | 1.91 | 0.11 |
| Powered Pedestal PECVD chamber | 1 | 4460 | 0.9 | 2.06 | 0.16 |
| | 1.5 | 13700 | 1.8 | 1.99 | 0.16 |

A fourfold increase in deposition rate was observed for the powered pedestal operated at 1 Torr. High refractive index was also observed.

In general high deposition rate processes that are able to produce AHMs having refractive indexes of ~2.0 can be achieved with the powered pedestal PECVD apparatuses. On the standard PECVD apparatus as used in the examples above, processing at high temperature (>500 C) was required to achieve a refractive index of ~2.0. Such films have a deposition rate of ~1000 Å/min and a transparency of about 0.4. By contrast, AHMs having a refractive index of about 2.0 are able to be deposited using a powered pedestal at higher deposition rate and having lower transparency.

Deposition rate on standard and powered pedestal PECVD apparatuses at 7.75 Torr was also compared—similar deposition rates were achieved on both apparatuses at the high pressure.

Low 'k'/high transparency AHMs were deposited using standard and powered pedestal (dual RF mesh) PECVD chambers using the following conditions:
Gas: 3000 sccm $C_2H_2$/1500 sccm He/1500 $H_2$
HFRF power: 100 W
LFRF power: 600 W
Total pressure: 0.9 Torr (see Table 4)
Temperature: 250 C
Deposition rate, % non-uniformity of the film, refractive index (n) at 633 nm, and transparency (k) at 633 nm were measured for each process:

TABLE 5

| Chamber | Total Pressure (Torr) | Deposition Rate at wafer center (Å/min) | Non-uniformity % | n @ 633 nm | k @ 633 nm |
|---|---|---|---|---|---|
| Powered Pedestal PECVD chamber | 0.9 | 5500 | 1.0 | 1.99 | 0.09 |

High deposition rate, low non-uniformity, high index of refraction (high etch selectivity) and low extinction coefficient (high transparency) were observed.

CONCLUSION

Although the foregoing invention has been described in some detail for purposes of clarity of understanding, it will be apparent that certain changes and modifications may be practiced within the scope of the appended claims. It should be noted that there are many alternative ways of implementing both the process and compositions of the present invention. Accordingly, the present embodiments are to be considered as illustrative and not restrictive, and the invention is not to be limited to the details given herein.

What is claimed is:

1. A method of forming a carbon-based film, comprising:
providing a semiconductor device substrate to a pedestal in a deposition chamber;
powering the pedestal with RF power having a high frequency (HF) component and a lower frequency (LF) component, wherein the LF:HF ratio is between about 5:1 and 20:1;
exposing the substrate to a process gas comprising a hydrocarbon precursor gas, wherein the partial pressure of the hydrocarbon precursor is between about 0.01 and 4 Torr; and
depositing on the substrate a carbon-based film by a plasma enhanced chemical vapor deposition (PECVD) process.

2. The method of claim 1 wherein the total chamber pressure is less than about 2 Torr.

3. The method of claim 2 wherein the hydrocarbon precursor is ethylene.

4. The method of claim 2 wherein the hydrocarbon precursor is acetylene.

5. The method of claim 1 wherein the HF component of the RF power is between about 100 W and 1000 W, and the LF component of the RF power is between about 500 W and 5000 W, and wherein the LF:HF ratio is between about 5:1 and 10:1.

6. The method of claim 1 wherein the process temperature is between about 200 and 400 C.

7. The method of claim 1 wherein the process gas further comprises hydrogen gas.

8. The method of claim 7 wherein the partial pressure of the hydrogen gas is between about 1.0-1.5 Torr and the partial pressure of the hydrocarbon precursor is between about 0.05-0.5 Torr.

9. The method of claim 1 wherein the resulting carbon-based film has an extinction coefficient (k) of less than about 0.1 at 633 nm.

10. The method of claim 1 wherein the resulting carbon-based film has a carbon content between about 50-70%.

11. The method of claim 1 wherein the resulting carbon-based film has an etch selectivity of between about 12:1 and 20:1 compared to an underlying dielectric material.

12. The method of claim 1 wherein the resulting carbon-based film has an etch selectivity of between about 15:1 and 20:1 compared to an underlying dielectric material.

13. The method of claim 1 further comprising depositing a photoresist material over the carbon-based film.

14. The method of claim 1 wherein the partial pressure of the hydrocarbon precursor is less than about 0.5 and the total pressure in the deposition chamber is less than about 2 Torr.

15. The method of claim 1 wherein the resulting carbon-based film has a refractive index of at least 1.93.

16. The method of claim 1, wherein the carbon-based film has an sp3:sp2 ratio of about 3:1 or higher.

17. The method of claim 1, wherein the carbon-based film is an ashable hard mask.

18. The method of claim 1, wherein the PECVD process is driven by a capacitively coupled plasma.

19. A method of forming a carbon-based film, comprising:
  providing a semiconductor device substrate to a pedestal in a deposition chamber;
  powering the pedestal with RF power, wherein the RF power has a high frequency (HF) component of between about 100 W and 1000 W and a lower frequency (LF) component of between about 500 W and 5000 W and the LF:HF ratio is between about 5:1 and 20:1;
  exposing the substrate to a process gas comprising a hydrocarbon precursor gas; and
  depositing on the substrate a carbon-based film by a plasma enhanced chemical vapor deposition (PECVD) process.

* * * * *